(12) United States Patent  
Yoshioka et al.

(10) Patent No.: US 7,711,917 B2  
(45) Date of Patent: May 4, 2010

(54) SEMICONDUCTOR DEVICE AND IC CARD

(75) Inventors: Kazuki Yoshioka, Osaka (JP); George Nakane, Nara (JP); Yoshitaka Mano, Nara (JP)

(73) Assignee: Panasonic Corporation, Osaka (JP)

( * ) Notice: Subject to any disclaimer, the term of this patent is extended or adjusted under 35 U.S.C. 154(b) by 447 days.

(21) Appl. No.: 11/896,668

(22) Filed: Sep. 5, 2007

(65) Prior Publication Data

US 2008/0059703 A1    Mar. 6, 2008

(30) Foreign Application Priority Data

Sep. 5, 2006    (JP) .............................. 2006-240011

(51) Int. Cl.
    *G06F 12/16* (2006.01)
(52) U.S. Cl. .................... 711/165; 711/103; 711/162; 365/185.01; 365/228
(58) Field of Classification Search ................... None
    See application file for complete search history.

(56) References Cited

U.S. PATENT DOCUMENTS 5,875,136 A * 2/1999 Hsuan et al. ............... 365/200

2005/0125595 A1    6/2005  Takeuchi et al.

FOREIGN PATENT DOCUMENTS

| JP | 2000-259602 | 9/2000 |
|---|---|---|
| JP | 2004-102635 | 4/2004 |

* cited by examiner

*Primary Examiner*—Jack A Lane  
(74) *Attorney, Agent, or Firm*—McDermott Will & Emery LLP

(57) ABSTRACT

A semiconductor device according to the present invention comprises a first non-volatile memory, a second non-volatile memory in which initial data is stored, and an initialization controller for initializing the first non-volatile memory, wherein the second non-volatile memory has anti-stress properties higher than those of the first non-volatile memory, and the initialization controller reads the initial data from the second non-volatile memory when the first non-volatile memory is initialized and copies the read initial data in the first non-volatile memory to thereby initialize the first non-volatile memory.

13 Claims, 7 Drawing Sheets

F I G. 2
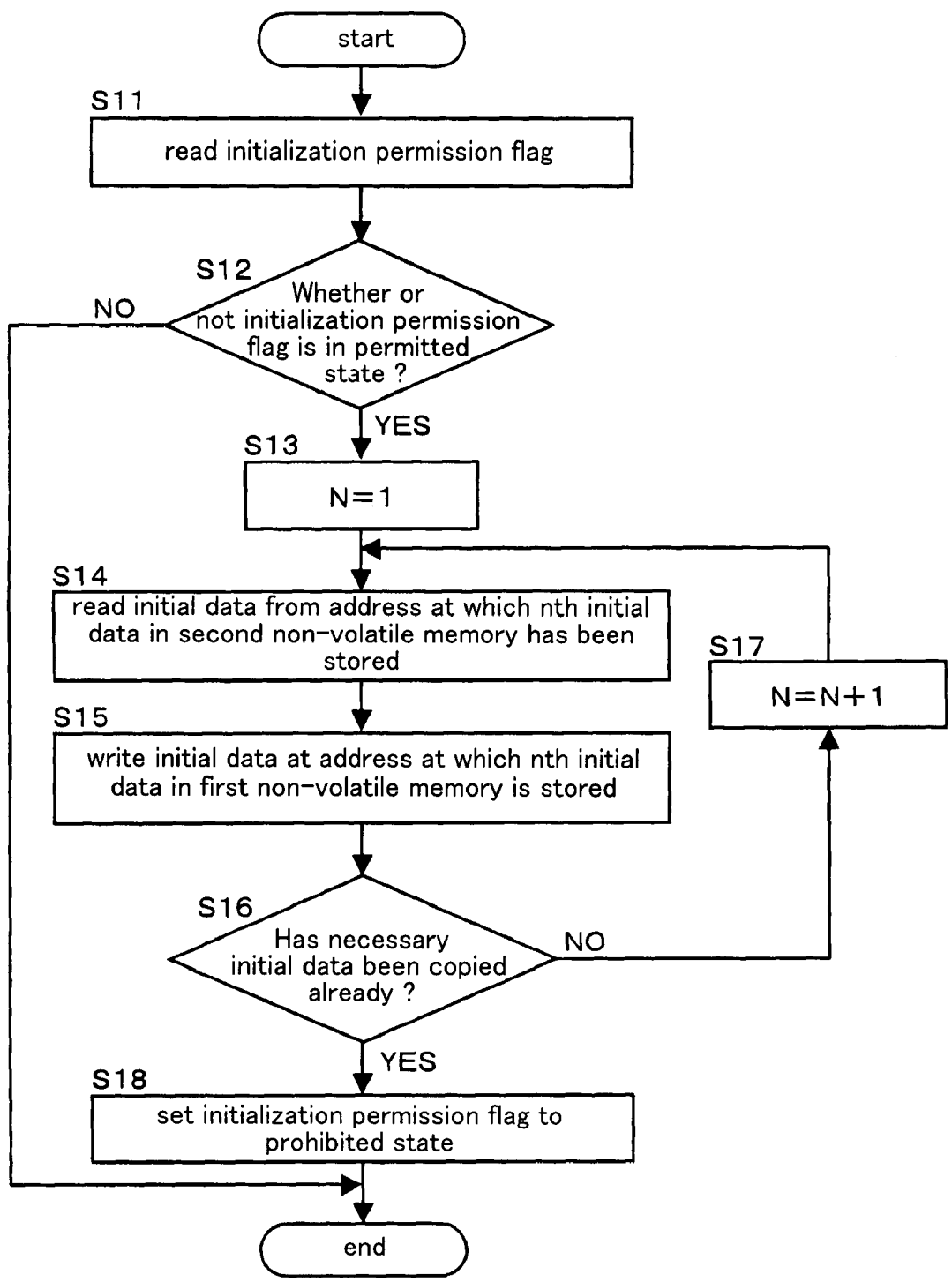

SEMICONDUCTOR DEVICE AND IC CARD

BACKGROUND OF THE INVENTION

1. Field of the Invention

The present invention relates to a semiconductor device and an IC card having a non-volatile memory, more specifically to a technology for reliably initializing data in the non-volatile memory.

2. Description of the Related Art

A non-volatile memory, which is capable of retaining data without any power supply thereto, is often installed in LSI. Any necessary initial data is stored in the non-volatile memory when the non-volatile memory is installed in LSI, and the LSI provided with the non-volatile memory in which such necessary data is stored is shipped. Examples of the initial data include product management information used when the LSI is manufactured, various information used when the quality of a product is judged and various data such as model-specific information, as recited in Japanese Patent Document (Japanese Patent Laid-Open Publication No. 2000-259602). Such data is used in order to facilitate maintenance service when the product is found defective after the shipment.

In the LSI installed in the IC card, a transportation key is used in order to prevent any illegal use resulting from theft of the LSI and the IC card during the transportation (for example, see Japanese Patent Document (Japanese Patent Laid-Open Publication No. 2004-102635)). Information of the transportation key is stored in the non-volatile memory as initial data when the LSI is manufactured, and then, the LSI is shipped. In addition to the above-mentioned data, other initial data such as configuration information for setting functions of the LSI is also stored in the non-volatile memory by a manufacturer of the LSI.

There are a wide variety of non-volatile memories, including a ferroelectric memory, EEPROM, a fuse memory and a mask ROM, and each of these memories has advantages and disadvantages. For example, the ferroelectric memory is advantageous in its remarkable access speed and rewritability; however, is unfavorably inferior to the other non-volatile memories in its anti-stress properties (heat-resistant stress property and anti-stress property. Further, the fuse memory, for example, is superior in its anti-stress properties and data retaining performance; however, is disadvantageously rewritable only once.

The LSI may undergo some kind of stress in any of manufacturing steps before the LSI is made into a final product. For example, when the LSI is mounted on a substrate, a thermal stress of approximately 250° C. is applied to the LSI in a reflow step wherein the LSI package is soldered to the substrate. However, in the case where the ferroelectric memory is used as the non-volatile memory, the initial data may be destroyed due to the thermal stress during a manufacturing step. On the other hand, in the case of the fuse memory and the EEPROM whose anti-stress properties are high, such basic performance as the access speed and rewritability fail to satisfy demanded specification.

SUMMARY OF THE INVENTION

Therefore, a main object of the present invention is to enable a semiconductor device and an IC card in which the non-volatile memory is stored to unfailingly retain initial data without deteriorating basic performance demanded in a non-volatile memory.

In order to achieve the foregoing object, a semiconductor device according to the present invention comprises:
a first non-volatile memory;
a second non-volatile memory in which initial data is stored; and
an initialization controller for initializing the first non-volatile memory, wherein
the second non-volatile memory has anti-stress properties higher than those of the first non-volatile memory, and
the initialization controller reads the initial data from the second non-volatile memory when the first non-volatile memory is initialized and copies the read initial data in the first non-volatile memory to thereby initialize the first non-volatile memory.

In the foregoing constitution, the anti-stress properties (heat-resistant stress property/anti-stress property) of the second non-volatile memory are high. In an initial stage, the initial data is stored in the second non-volatile memory whose anti-stress properties are high. Because the anti-stress properties of the second non-volatile memory are high, the initial data retained in the second non-volatile memory can be reliably retained even though any stress or thermal stress is applied to the LSI after the shipment. Therefore, after the stress or thermal stress is applied, the initial data can be accurately read from the second non-volatile memory and copied in the first non-volatile memory. There is not the initial data in the first non-volatile memory when the stress or thermal stress is applied, and the initial data is copied from the second non-volatile memory into the first non-volatile memory after the stress or thermal stress is applied. Because the stress or the thermal stress is not any more applied after the initial data is copied, the initial data can be reliably retained in the first non-volatile memory. The operation described above is most appropriate because the first non-volatile memory is superior in such performances as an access speed and rewritability, however, its anti-stress properties are relatively low. According to the present invention, the initial data can be reliably retained without deteriorating the performance of the non-volatile memories.

According to a preferable mode of the present invention, the initialization controller comprises:
a reader for reading the initial data from the second non-volatile memory; and
a writer for writing the read initial data into the first non-volatile memory.

According to another preferable mode of the present invention, the initialization controller invalidates a part of functions installed in the semiconductor device until the initialization of the first non-volatile memory by copying the initial data therein is completed and sets an initialization permission flag showing permission/prohibition of the initialization to a permitted sate, and
the initialization controller further shifts the initialization permission flag to a prohibited state upon the completion of the initialization of the first non-volatile memory by copying the initial data therein.

In the foregoing constitution, a part of the functions installed in the semiconductor device remain invalidated in the state where the initialization of the first non-volatile memory has not been completed yet. When a part of the functions remains invalidated, the relevant functions cannot be used, which motivates the initialization of the first non-volatile memory. The initialization is motivated because the initialization of the first non-volatile memory is necessary in order to actuate any unavailable function. The initialization of the first non-volatile memory is thus accelerated. Because the initialization permission flag at that time is not in the prohibited state but in the permitted state, the first non-volatile memory can be initialized. The initialization permission flag is kept in the permitted state until the initialization of the first non-volatile memory by the initialization controller is completed. When a part of the functions is not available in the permitted state, the initialization of the first non-volatile memory is accelerated, and thereby ensured.

As a preferable mode of the foregoing constitution, the initialization controller disallows a part or all of addresses in the second non-volatile memory to be accessed when the initialization permission flag is shifted to the prohibited state.

In the foregoing constitution, the initial data with a high confidentiality is stored at the addresses of the second non-volatile memory to which any access is not allowed. After the first non-volatile memory is initialized by the initialization controller, it is disallowed to access the addresses in the second non-volatile memory at which the highly confidential initial data is stored, which prevents exposure of the highly confidential initial data.

According to still another preferable mode of the present invention, a transfer destination address information is stored in the second non-volatile memory in association with the initial data, and the initialization controller stores the initial data read from the second non-volatile memory at an address in the first non-volatile memory designated by the transfer destination address information.

Accordingly, the address at which the initial data is stored can be changed. Therefore, such a case when the initial data of the first non-volatile memory is reformatted can be easily handled.

According to still another preferable mode of the present invention, the initialization controller further comprises a data processor, wherein the data processor executes a computing processing to the initial data read from the second non-volatile memory by the reader and supplies a result of the processing to the writer.

According to the constitution, when the initial data stored in the second non-volatile memory is encrypted, and the encrypted initial data is decoded in the data processor and the decoded data is copied in the first non-volatile memory, the initial data which is encrypted can be safely retained in the second non-volatile memory. In the case of, for example, such an initial data that is collated and changed at a destination of the transportation as in a transportation key, the initial data can be changed and stored at the same time. Therefore, the first non-volatile memory can be more efficiently initialized.

An IC card according to the present invention comprises:
the semiconductor device according to the present invention;
a transmitting/receiving circuit for performing communication with a reader/writer provided outside; and
a control circuit for controlling the initialization controller in the semiconductor device in accordance with a command received by the transmitting/receiving circuit and making the initialization controller to read the initial data from the second non-volatile memory and initialize the first non-volatile memory by copying the read initial data therein.

According to the constitution, in the IC card provided with the non-volatile memories, the initial data is stored in the second non-volatile memory whose anti-stress properties are high up to a step where the stress or the thermal stress is applied in a process of manufacturing the IC card, and the initial data is copied in the first non-volatile memory superior in its access speed and rewritability though its anti-stress properties are relatively low after the stresses are applied. As a result, the initial data stored in the non-volatile memories can be surely retained without deteriorating the performance of the non-volatile memories.

As thus described, according to the present invention, the initial data stored in the non-volatile memories can be surely retained without deteriorating the basic performance required in the non-volatile memories.

The semiconductor device according to the present invention is capable of unfailingly retaining the initial data even when the non-volatile memories whose anti-stress properties are relatively low are used. Therefore, the present invention is useful in a semiconductor device to which the initial data needs to be stored at the time of the shipment of LSI and a stress, a thermal stress or the like may be applied in any step before a final product is completed.

BRIEF DESCRIPTION OF THE DRAWINGS

These and other objects of the invention will become clear by the following description of preferred embodiments of the invention. A number of benefits not recited in this specification will come to the attention of the skilled in the art upon the implementation of the present invention.

FIG. 2 is a flow chart illustrating the operation of the semiconductor device according to the preferred embodiment 1.

DETAILED DESCRIPTION OF THE INVENTION

Figure 1:
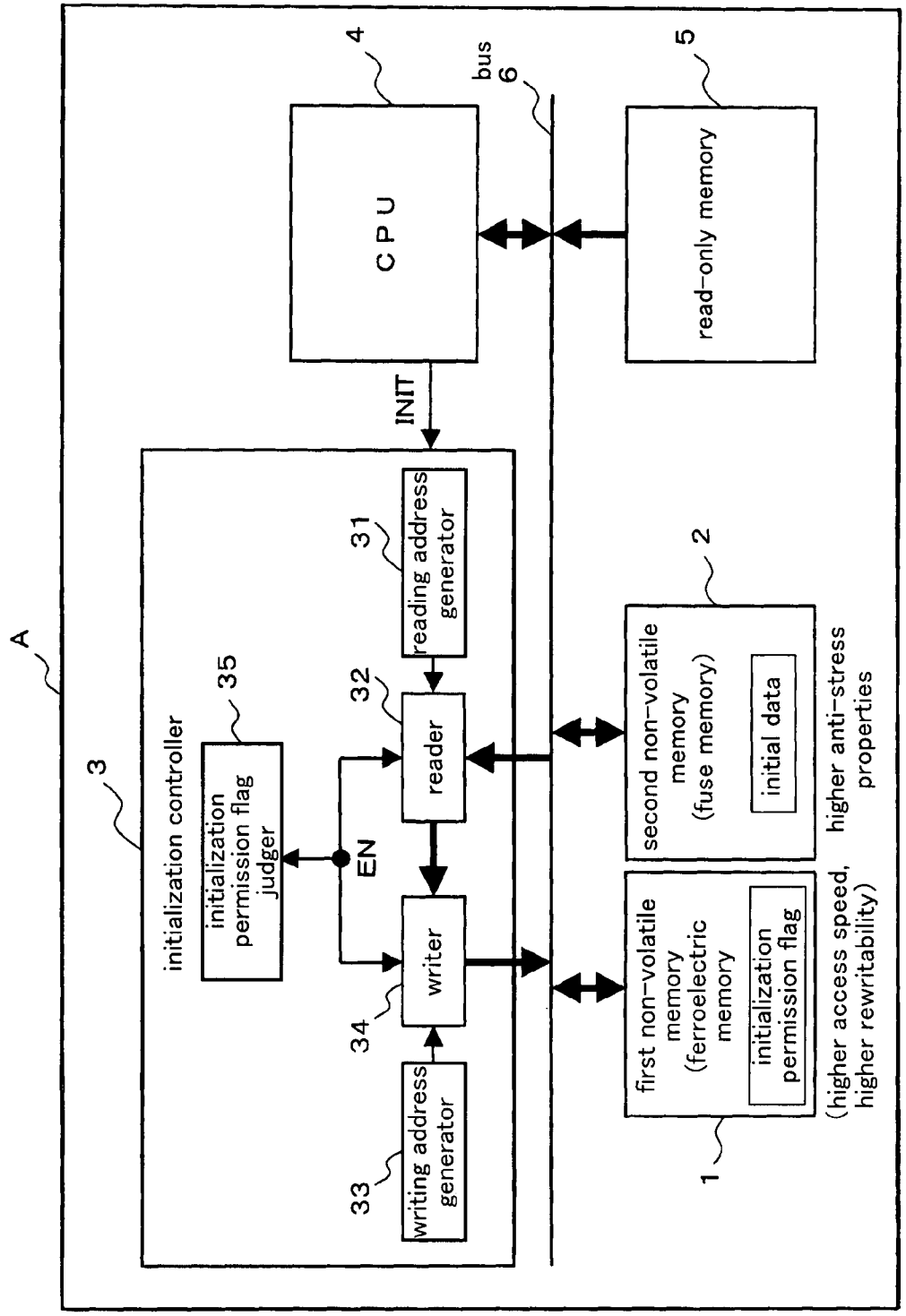
FIG. 1 is a block diagram illustrating a constitution of a semiconductor device according to a preferred embodiment 1 of the present invention.

Hereinafter, preferred embodiments of a semiconductor device and an IC card according to the present invention are described in detail referring to the drawings.

Preferred Embodiment 1

FIG. 1 is a block diagram illustrating a constitution of a semiconductor device A according to a preferred embodiment 1 of the present invention. The semiconductor device A comprises a first non-volatile memory 1, a second non-volatile memory 2, an initialization controller 3, a CPU 4, a read-only memory 5, and a bus 6 which connect these components.

The first non-volatile memory 1 is, for example, a ferroelectric memory superior in its access speed and rewritability. The second non-volatile memory 2 is, for example, a fuse memory which is a one-time writing memory having high anti-stress properties (anti-stress property/heat-resistant stress property). In an initial stage, initial data is stored in the second non-volatile memory 2 whose anti-stress properties are high, but not stored in the first non-volatile memory 1. In the first non-volatile memory 1, an initialization permission flag showing permission/prohibition of initialization is stored at predetermined addresses therein. The initialization permission flag is a value expressed by a predetermined number of bits. The initialization permission flag is retained even when a power supply is cut off.

The initialization controller 3 comprises a reading address generator 31, a reader 32, a writing address generator 33, a writer 34, and an initialization permission flag judger 35. The initialization controller 3 starts the initialization operation of the first non-volatile memory 1 upon reception of an initialization signal INIT from the CPU 4. The initialization operation means to read the initial data from the second non-volatile memory 2 and copy the read initial data in the first non-volatile memory 1. The reading address generator 31 sequentially generates addresses where the initial data in the second non-volatile memory 2 is stored. The writing address generator 33 sequentially generates the addresses in the first non-volatile memory 1 at which the initial data is to be stored. The reader 32 reads the initial data from the second non-volatile memory 2 based on the addresses generated by the reading address generator 31. The writer 34 writes the read initial data in the first non-volatile memory 1 based on the addresses generated by the writing address generator 33.

The initialization permission flag judger 35 reads the initialization permission flag from the first non-volatile memory 1, and judges if the initialization permission flag is in a permitted state or a prohibited state. The initialization permission flag judger 35 judges that the relevant flag is in the prohibited state when a value of the initialization permission flag is equal to a predetermined value, while judging that the relevant flag is in the permitted state when the value is not equal to the predetermined value. The initialization permission flag judger 35 generates an initialization permission signal EN when the relevant flag is in the permitted state and outputs the generated signal to the reader 32 and the writer 34.

Next, the operation of the semiconductor device A according to the present preferred embodiment thus constituted is described. The CPU 4 executes a program stored in the read-only memory 5, and also appropriately accesses the first non-volatile memory 1 and the second non-volatile memory 2. Further, the CPU 4 outputs the initialization signal INIT in accordance with the executed program. The initialization controller 3 starts the initialization operation of the first non-volatile memory 1 upon the reception of the initialization signal INIT. The operation of the initialization controller 3 is described below referring to a flow chart shown in FIG. 2. It is assumed that the stress or the thermal stress has already been applied before the initialization starts; however, it is assumed that the initialization of the first non-volatile memory 1 has not been completed yet. When the power supply is turned on and the initialization signal INIT is received from the CPU 4, the initialization controller 3 starts processing in and after Step S11.

First, in the Step S11, the reader 32 of the initialization controller 3 reads the initialization permission flag from the first non-volatile memory 1 via the bus 6, and delivers the read flag to the initialization permission flag judger 35.

Next, in Step S12, the initialization permission flag judger 35 makes the judgment on the initialization permission flag. When it is judged that the flag is in the prohibited state, the initialization permission flag judger 35 terminates the initialization operation. When it is judged that the flag is in the permitted state, the initialization permission flag judger 35 generates the initialization permission signal EN and outputs the generated signal to the reader 32 and the writer 34. Then, the processing advances to Step S13.

In Step S13, the initialization permission flag judger 35 sets a variable N showing that the Nth initial data should be copied as "1" which is an initial value. Then, in Step S14, the reading address generator 31 generates an address (reading address) at which the Nth initial data is stored in the second non-volatile memory 2, and the reader 32 reads the initial data from the second non-volatile memory 2 based on the reading address.

Then, in Step S15, the writing address generator 33 generates an address (writing address) at which the Nth initial data is to be stored in the first non-volatile memory 1. The writer 34 writes the initial data read in the Step S14 in the first non-volatile memory 1 based on the relevant writing address.

In Step S16, the initialization permission flag judger 35 judges if the necessary initial data has been copied. Then, the processing advances to Step S17 when it is judged that the copy has not been completed yet, while advancing to Step S18 when it is judged that the copy has been completed.

When the processing advances to the Step S17 based on the judgment that the necessary initial data has not been copied yet in the Step S16, the initialization permission flag judger 35 increments the variable N by (+1) and then the processing returns to the Step S14. The initialization controller 3 repeats the Steps S14-S17 while continuously incrementing the variable N by (+1) until the copy of the necessary initial data is completed. When the processing advances to the Step S18 based on the judgment that the copy of the necessary initial data is completed in the Step S16, the initialization controller 3 changes the state of the initialization permission flag to the prohibited state. Then, the initialization operation is terminated.

As described, according to the present preferred embodiment, the initial data is kept stored in the second non-volatile memory 2 whose anti-stress properties are high though its rewritability is relatively poor up to the step where the stress is applied, while the initial data is copied in the first non-volatile memory 1 whose anti-stress properties are relatively low though its access speed and rewritability are high after the stress is applied. As a result, the initial data can be reliably retained while the basic performance demanded in the non-volatile memories are being satisfied.

There are the following modification examples of the present preferred embodiment.

1) In the state where the initialization of the first non-volatile memory 1 by copying the initial data therein has not been completed yet, a part of the installed functions is invalidated, and the initialization permission flag is kept in the permitted state. A part of the install functions is invalidated when the use of a library function and a device driver stored in the read-only memory 5 is prohibited in such a manner that an accessible region in the read-only memory 5 is restricted. In such a state, a part of the functions remain invalidated and cannot be used, which motivates the initialization of the first non-volatile memory 1. The motivation results from the fact that it is indispensable to initialize the first non-volatile memory 1 in order to actuate the library function and the device driver stored in the read-only memory 5. Thus, the motivation accelerates the initialization of the first non-volatile memory 1. The first non-volatile memory 1 can be initialized because the initialization permission flag is not in the prohibited state but in the permitted state. Thus, the initialization controller 3 keeps the initialization permission flag in the permitted state until the initialization of the first non-volatile memory 1 is completed. Under this condition, the initialization controller 3 judges whether or not a part of the functions is in the invalidated state. When it is confirmed that a part of the functions is invalidated, the initialization controller 3 initializes the first non-volatile memory 1, and the first non-volatile memory 1 can be thereby surely initialized. In response to the completion of the initialization of the first non-volatile memory 1, the initialization permission flag is shifted to the prohibited state.

2) It is assumed that in the second non-volatile memory 2, the initial data having a high confidentiality is stored. When the initialization permission flag is shifted to the prohibited state in response to the completion of the initialization of the first non-volatile memory 1, it is disallowed to access a part or all of the addresses in the second non-volatile memory 2 where the highly confidential initial data is stored. Thus, the possibility of exposure of the highly confidential initial data can be reduced.

Preferred Embodiment 2

Figure 3:
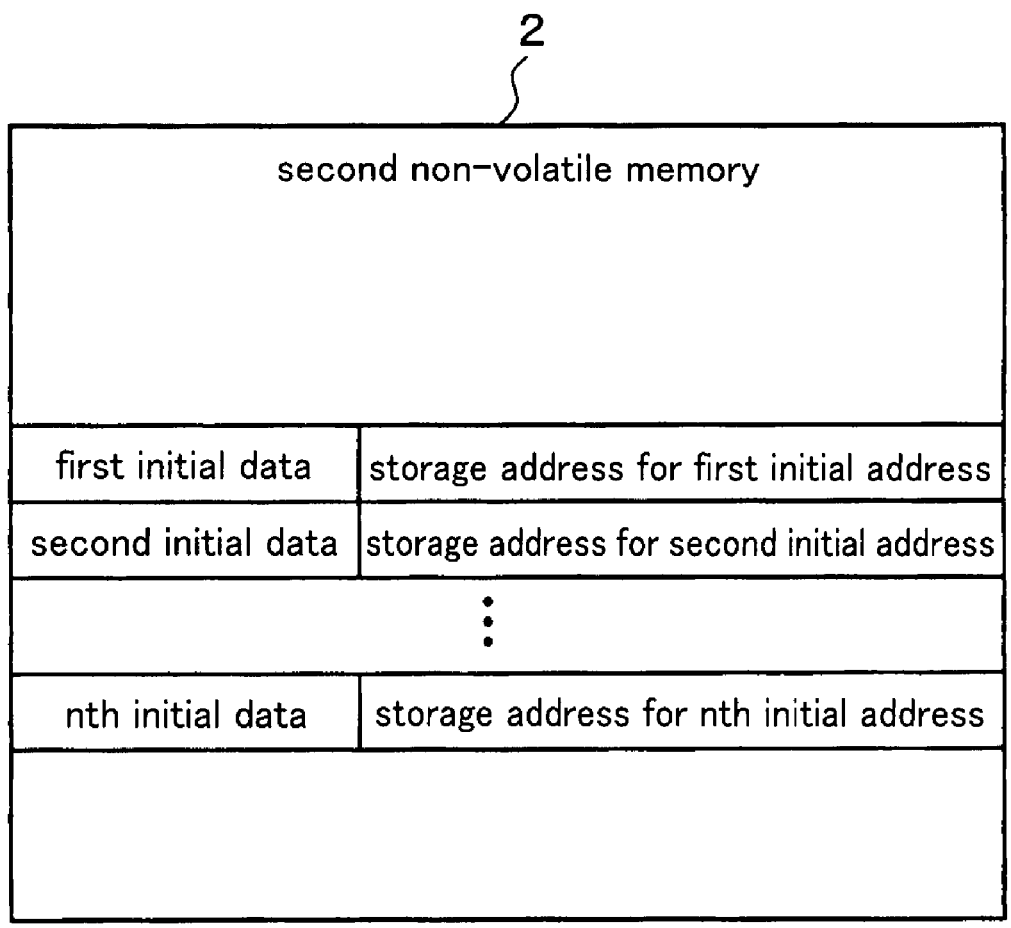
FIG. 3 shows a format of initial data in a semiconductor device according to a preferred embodiment 2 of the present invention.

FIG. 3 shows a format of initial data stored in a second non-volatile memory 2 of a semiconductor device according to a preferred embodiment 2 of the present invention. In the format, the initial data and an address information for storing the initial data are associated with each other. A semiconductor device A according to the present preferred embodiment decides where the initial data is stored in the first non-volatile memory 1 based on the address information stored in the second non-volatile memory 2. The semiconductor device A according to the present preferred embodiment is constituted in the same manner as the semiconductor device according to the preferred embodiment 1.

Figure 4:
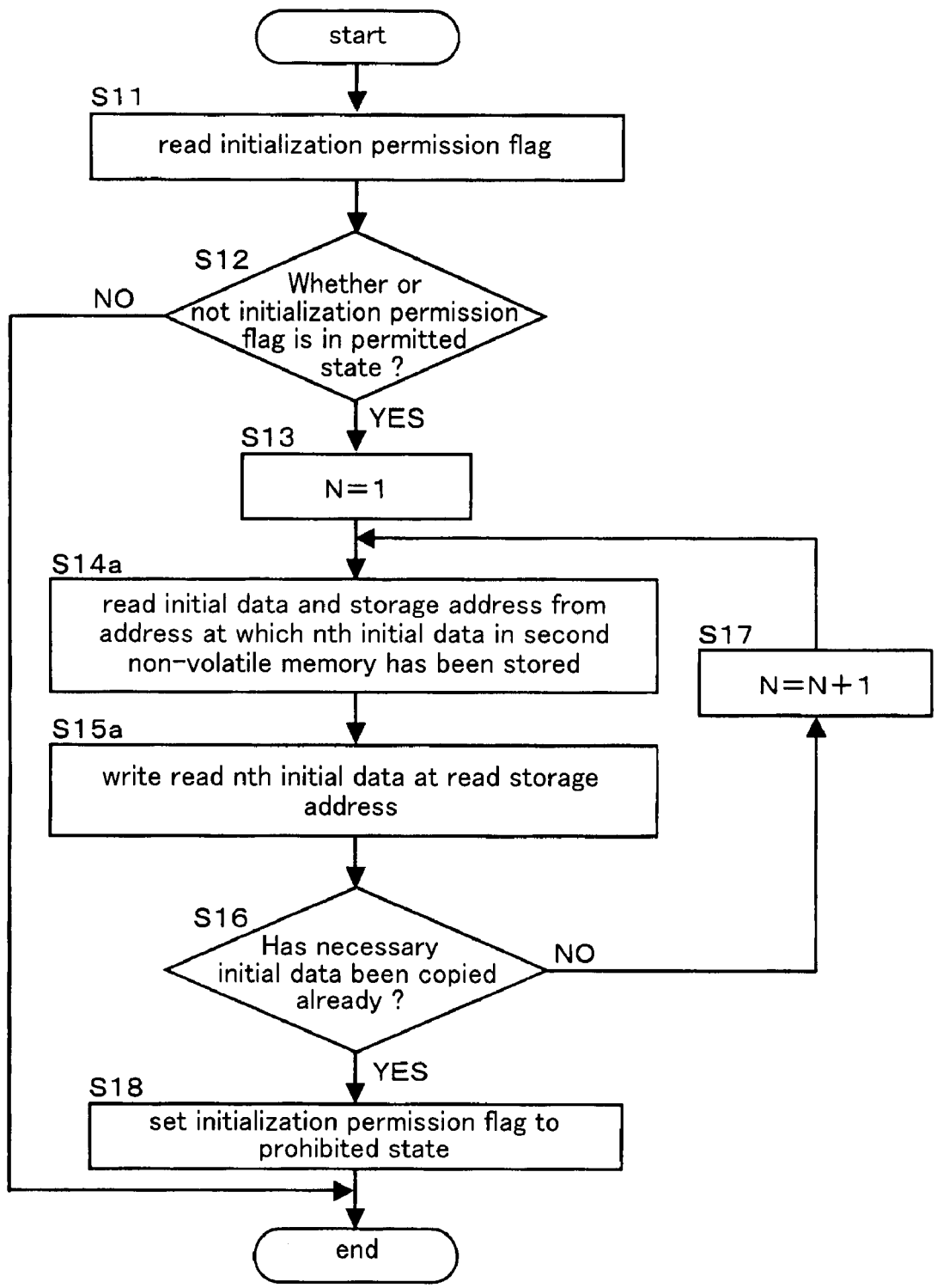
FIG. 4 is a flow chart illustrating the operation of the semiconductor device according to the preferred embodiment 2.

FIG. 4 is a flow chart in the case where the initial data is copied based on the format of the initial data shown in FIG. 3. The flow chart is different from the flow chart shown in FIG. 2 in that Steps S14a and S15a are provided, respectively, in place of the Steps S14 and S15. Below is given a description focusing on differences between the two flow charts shown in FIGS. 2 and 3, and the same steps are not described again.

In the Step S14a, the reader 32 accesses the second non-volatile memory 2 based on the reading address generated by the reading address generator 31, and reads the initial data and the address at which the initial data is to be stored.

Next, in the Step S15a, the writer 34 writes the initial data read in the Step S14a at the address at which the initial data is to be stored in the first non-volatile memory 1 read in the Step S14a. At the time, the writing address generator 33 halts its function.

According to the present preferred embodiment, the destination for storing the initial data in the first non-volatile memory 1 can be changed. Therefore, such a case when the initial data in the first non-volatile memory 1 is reformatted can be easily handled.

Preferred Embodiment 3

Figure 5:
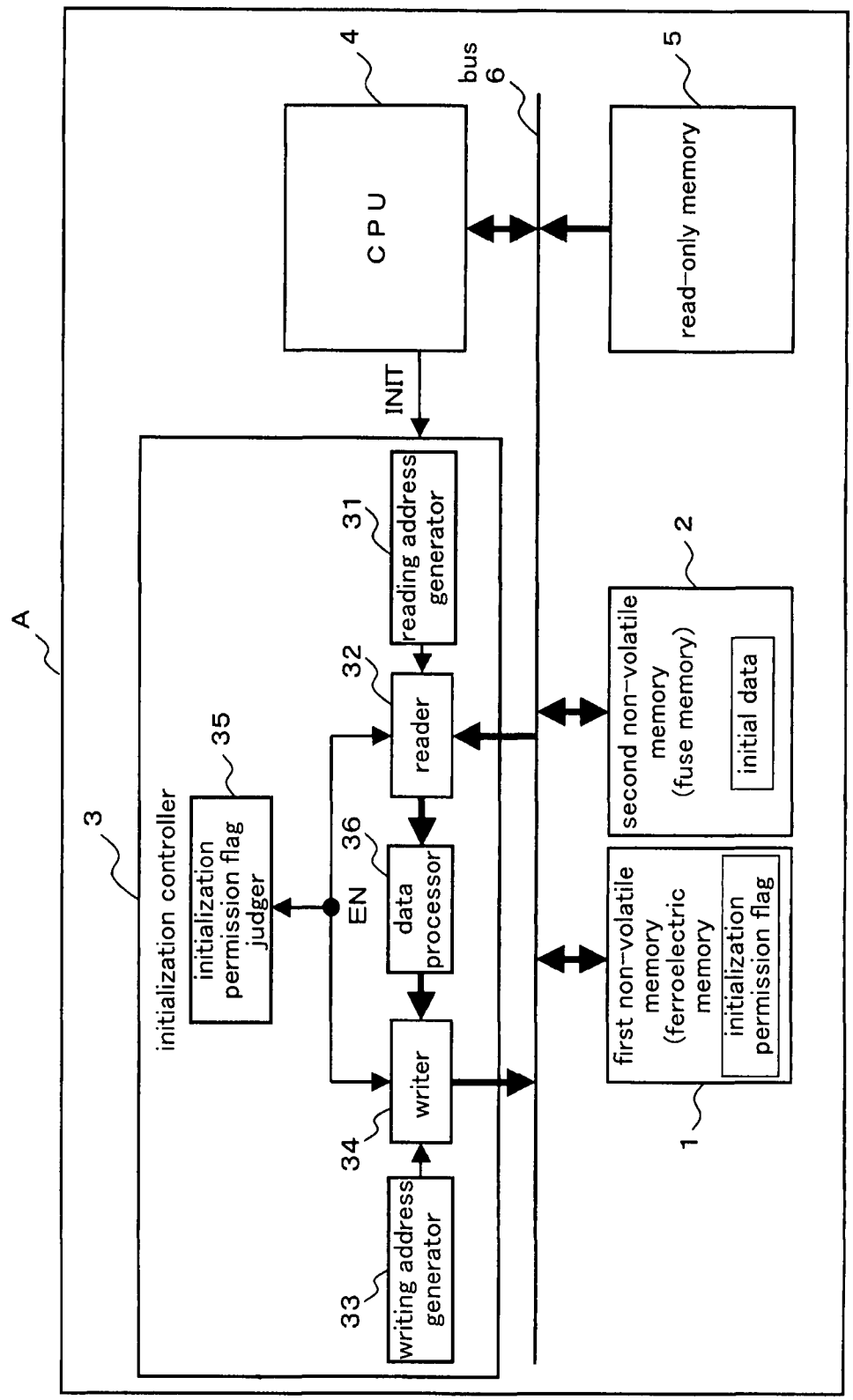
FIG. 5 is a block diagram illustrating a constitution of a semiconductor device according to a preferred embodiment 3 of the present invention.

FIG. 5 is a block diagram illustrating a constitution of a semiconductor device A according to a preferred embodiment 3 of the present invention. In FIG. 5, the same reference symbols as those shown in FIG. 1 according to the preferred embodiment 1 denote the same components. The constitution according to the present preferred embodiment is characterized as follows. In the second non-volatile memory 2, the initial data that is encrypted is stored. In the present preferred embodiment, a data processor 36 is further provided in the initialization controller 3. The data processor 36 executes a predetermined computing processing (logical computation and numerical computation) to the initial data read from the second non-volatile memory 2 by the reader 32, and outputs a result of the computation to the writer 34. The writer 34 writes the computation result (data) of the data processor 36 in the first non-volatile memory 1. The rest of the constitution, which is similar to that of the preferred embodiment 1, is not described again.

The operation of the semiconductor device A according to the present preferred embodiment thus constituted is described. In place of copying the initial data stored in the second non-volatile memory 2 directly in the first non-volatile memory 1, the computation result (data) obtained by executing the predetermined computing processing to the read initial data is stored as the initial data of the first non-volatile memory 1. For example, the encrypted initial data that is stored in the second non-volatile memory 2 is decoded by the data processor 36, and then, the decoded data is stored in the first non-volatile memory 1. When the initial data stored in the second non-volatile memory 2 is thus encrypted, the initial data can be more safely retained. In the case of the initial data which is collated and then changed at a destination of the transportation as in the case of a transportation key, the initial data can be changed and stored at the same time. Therefore, the first non-volatile memory can be more efficiently initialized. The data processor 36 may be configured so as to execute the data processing only to a particular initial data.

Preferred Embodiment 4

Figure 6:
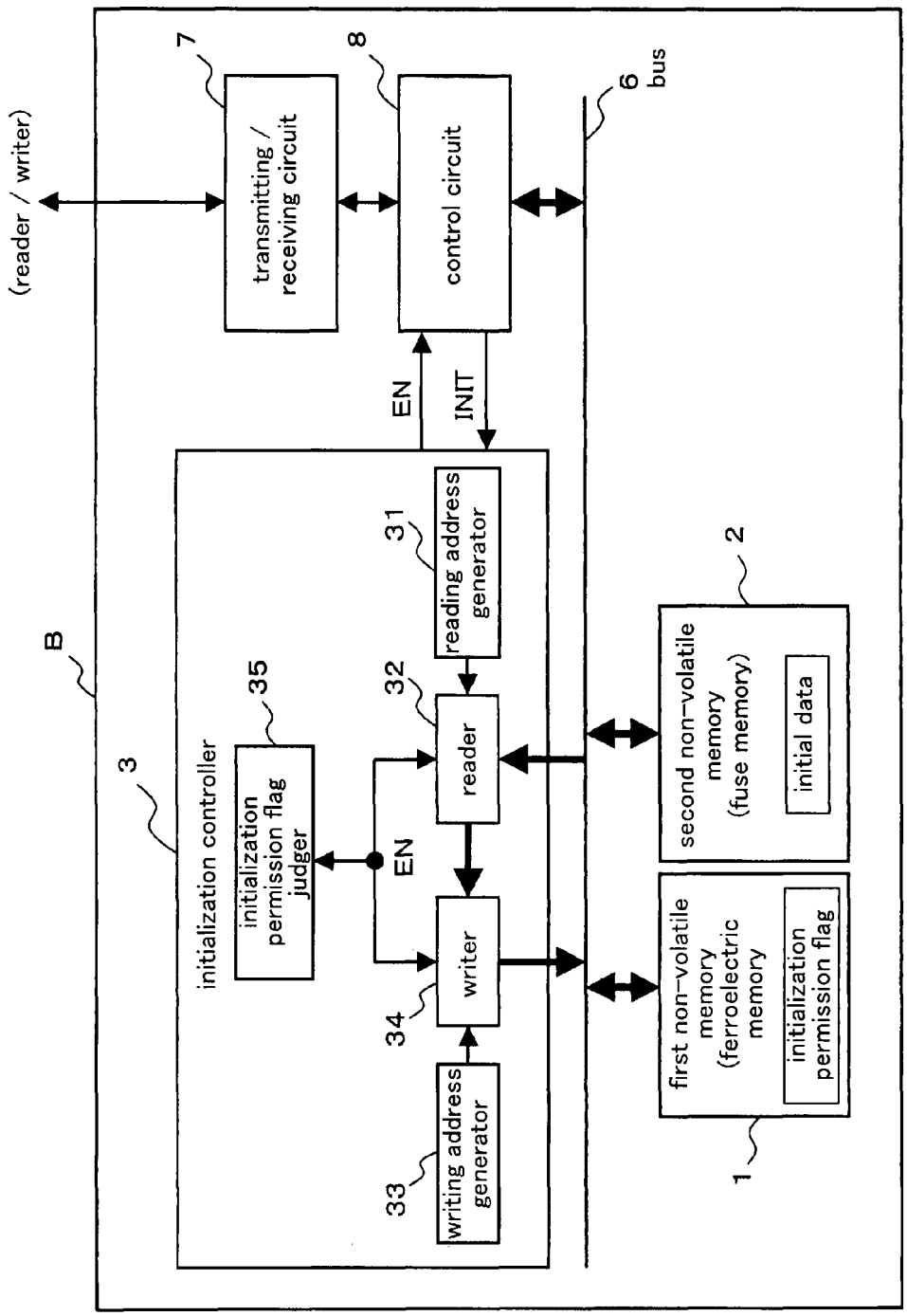
FIG. 6 is a block diagram illustrating a constitution of an IC card according to a preferred embodiment 4 of the present invention.

FIG. 6 is a block diagram illustrating a constitution of an IC card B according to a preferred embodiment 4 of the present invention. The IC card B comprises a first non-volatile memory 1, a second non-volatile memory 2, an initialization controller 3, a bus 6, a transmitting/receiving circuit 7, and a control circuit 8. The first non-volatile memory 1, second non-volatile memory 2, and initialization controller 3 were already described in the preferred embodiment 1 and the likes.

The transmitting/receiving circuit 7 executes a radio communication or a cable communication with outside to thereby receive a command from a reader/writer not shown, and transmits a response to the reader/writer. The control circuit 8 accesses the first non-volatile memory 1 in accordance with the command received by the transmitting/receiving circuit 7 to thereby write and read the data, and accordingly transmits the read data to the transmitting/receiving circuit 7. The control circuit 8 generates the initialization signal INIT when the command received from the reader/writer is a card test command and outputs the generated signal to the initialization controller 3. The control circuit 8 does not execute the processing to any command other than the card test command (for example, writing command or reading command) when the initialization permission flag is judged to be in the permitted state by the initialization permission flag judger 35. The control circuit 8 does not process the card test command when the initialization permission flag is judged to be in the prohibited state. Since the rest of the constitution is similar to that of the preferred embodiment 1, the same components are simply provided with the same reference symbols and are not described in detail again.

Figure 7:
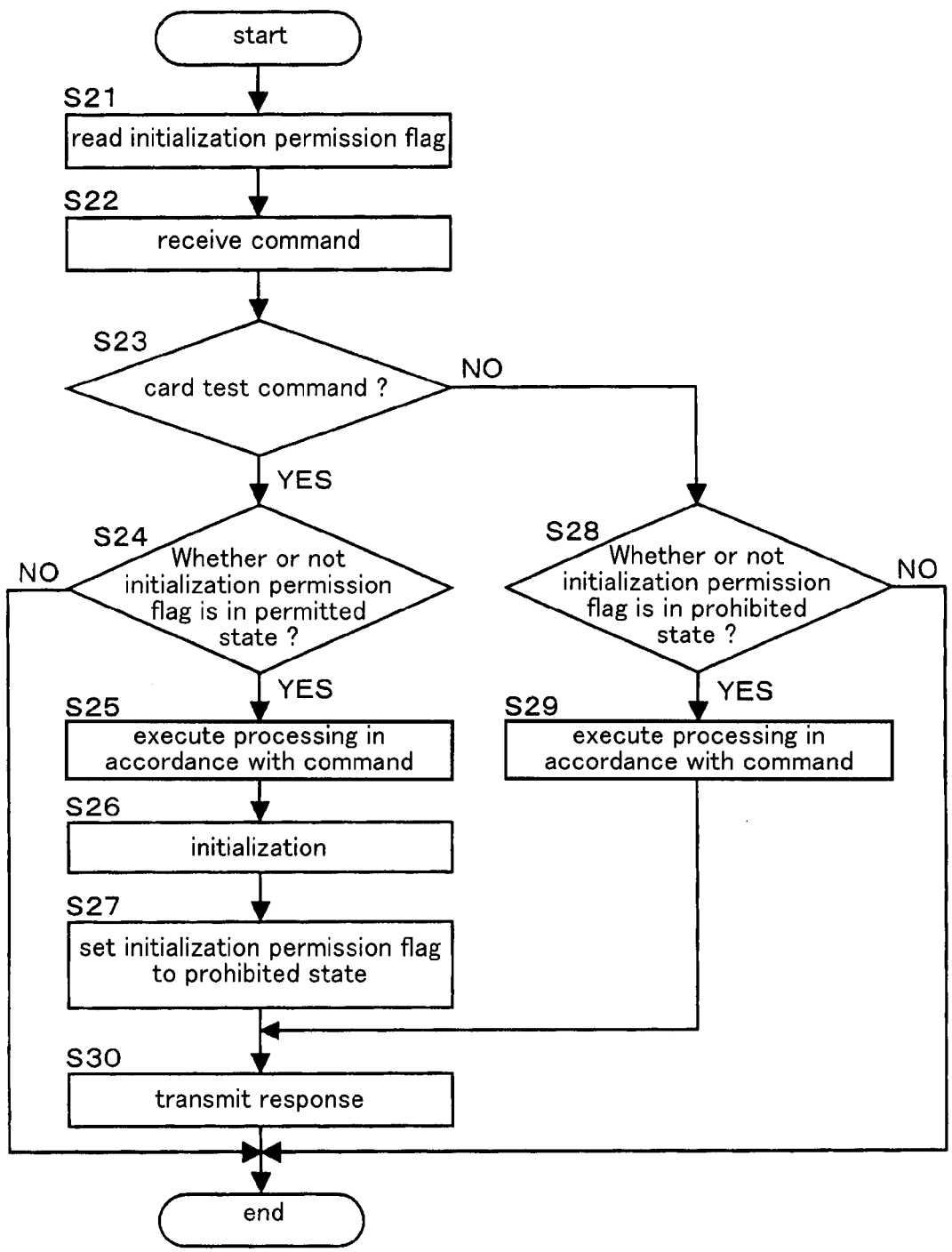
FIG. 7 is a flow chart illustrating the operation of IC according to the preferred embodiment 4.

The operation of the IC card B is described referring to the flow chart shown in FIG. 7. First, when the power supply is turned on, in Step S21, the reader 32 of the initialization controller 3 reads the initialization permission flag from the first non-volatile memory 1 via the bus 6 and delivers the read flag to the initialization permission flag judger 35. Next, in Step S22, the transmitting/receiving circuit 7 receives the command outputted from the reader/writer. Then, in Step S23, the control circuit 8 judges whether or not the received command is the card test command. The processing advances to Step S24 when it is judged that the received command is the card test command, while advancing to Step S28 when it is judged that the received command is not the card test command.

In the Step S24, the initialization permission flag judger 35 makes the judgment on the initialization permission flag. When the initialization permission flag is judged to be in the prohibited state, the initialization is terminated. When the initialization permission flag is judged to be in the permitted state, the processing advances to Step S25. In the Step S25, the processing in accordance with the command is executed. Then, in Step S26, the initialization controller 3 initializes the first non-volatile memory 1. The details of the initialization are similar to those of the preferred embodiment 1. After the initialization is completed, the initialization permission flag is set to the prohibited state in Step S27.

Then, in Step S30, a response is transmitted from the transmitting/receiving circuit 7 to the reader/writer. When the initialization permission flag is judged to be in the prohibited state in the Step S24, the processing is terminated without the transmission of the response.

When the processing advances to the Step S28 in the case where the received command is other than the card test command, it is judged whether or not the initialization permission flag is in the prohibited state. The processing advances to Step S29 when the initialization permission flag is judged to be in the prohibited state, wherein the processing in accordance with the command is executed. Then, the processing advances to Step S30 in which the response is transmitted. The processing is terminated without the transmission of the response when the initialization permission flag is judged to be in the permitted state in the Step S28.

As described, according to the present preferred embodiment, the first non-volatile memory 1 is initialized in accordance with the command received by the transmitting/receiving command 7 in the IC card B provided with the non-volatile memories. Therefore, the first non-volatile memory 1 can be initialized in conjunction with the card test. Further, the initial data is stored in the second non-volatile memory 2 whose anti-stress properties are high though its rewritability is relatively poor up to the step where the stress is applied, while the initial data is copied in the first non-volatile memory 1 whose anti-stress properties are relatively low though its access speed and rewritability are high after the stress is applied. Thereby, the initial data can be unfailingly retained while the basic performance demanded in the non-volatile memories are being satisfied.

Further, the IC card B can be more safely used because it is unnecessary to process any ordinary command in the state where the first non-volatile memory 1 has not been initialized yet.

In any of the preferred embodiments described so far, a software processing executed in the CPU 4 may constitute the initialization controller 3, in which case the initialization controller 3 in the form of a hardware component becomes unnecessary.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A semiconductor device comprising:
a first non-volatile memory;
a second non-volatile memory in which initial data is stored; and
an initialization controller for initializing the first non-volatile memory, wherein
the second non-volatile memory has anti-stress properties higher than those of the first non-volatile memory, and
the initialization controller reads the initial data from the second non-volatile memory when the first non-volatile memory is initialized and copies the read initial data in the first non-volatile memory to thereby initialize the first non-volatile memory.

2. The semiconductor device as claimed in claim 1, wherein
the initialization controller comprises:
a reader for reading the initial data from the second non-volatile memory; and
a writer for writing the read initial data into the first non-volatile memory.

3. The semiconductor device as claimed in claim 2, wherein
the initialization controller further comprises a data processor, wherein
the data processor executes a computing processing to the initial data read from the second non-volatile memory by the reader and supplies a result of the processing to the writer.

4. The semiconductor device as claimed in claim 1, wherein
the initialization controller invalidates a part of functions installed in the semiconductor device until the initialization of the first non-volatile memory by copying the initial data therein is completed and sets an initialization permission flag showing permission/prohibition of the initialization to a permitted state, and
the initialization controller further shifts the initialization permission flag to a prohibited state upon the completion of the initialization of the first non-volatile memory by copying the initial data therein.

5. The semiconductor device as claimed in claim 4, wherein
the initialization controller prohibits access to
a part or all of addresses in the second non-volatile memory when the initialization permission flag is shifted to the prohibited state.

6. The semiconductor device as claimed in claim 1, wherein
a transfer destination address information is stored in the second non-volatile memory in association with the initial data, and
the initialization controller stores the initial data read from the second non-volatile memory at an address in the first non-volatile memory designated by the transfer destination address information.

7. An IC card comprising:
the semiconductor device as claimed in claim 1;
a transmitting/receiving circuit for performing communication with a reader/writer provided outside; and
a control circuit for controlling the initialization controller in the semiconductor device in accordance with a command received by the transmitting/receiving circuit and making the initialization controller to read the initial data from the second non-volatile memory and initialize the first non-volatile memory by copying the read initial data therein.

8. A method of initializing a semiconductor device comprising:

a step of providing a first non-volatile memory and a second non-volatile memory having anti-stress properties higher than those of the first non-volatile memory in the semiconductor device;

a step of storing initial data in the second non-volatile memory; and a step of initializing the first non-volatile memory by reading the initial data from the second non-volatile memory and copying the read initial data in the first non-volatile memory.

9. The method of initializing a semiconductor device as claimed in claim 8, wherein the step of initializing the first non-volatile memory is performed after processing which applies a stress to the semiconductor device is executed to the semiconductor device.

10. The method of initializing a semiconductor device as claimed in claim 8, wherein in the step of storing the initial data, a part of functions installed in the semiconductor device is invalidated and an initialization permission flag showing permission/prohibition of the initialization is set to a permitted state in a state where the initialization of the first non-volatile memory by copying the initial data therein is not yet completed, and the initialization permission flag is set to a prohibited state in response to the completion of the initialization of the first non-volatile memory by copying the initial data therein.

11. The method of initializing a semiconductor device as claimed in claim 10, wherein it is disallowed to access a part or all of addresses in the second non-volatile memory when the initialization permission flag is shifted to the prohibited state in the step of storing the initial data.

12. The method of initializing a semiconductor device as claimed in claim 8, wherein a transfer destination address information is stored in the second non-volatile memory in association with the initial data in the step of storing the initial data, and the initial data read from the non-volatile memory is stored at an address in the first non-volatile memory designated by the transfer destination address information in the step of initializing the first non-volatile memory.

13. The method of initializing a semiconductor device as claimed in claim 8, wherein a computing processing is executed to the initial data read from the second non-volatile memory, a result of the computation is copied in the first non-volatile memory so that the first non-volatile memory is initialized in the step of initializing the first non-volatile memory.

* * * * *